United States Patent [19]

Mizumo

[11] Patent Number: 5,615,088
[45] Date of Patent: Mar. 25, 1997

[54] FLEXIBLE PRINTED CIRCUIT DEVICE

[75] Inventor: Yoshiyuki Mizumo, Kaizuka, Japan

[73] Assignee: Minolta Co., Ltd., Osaka, Japan

[21] Appl. No.: 517,076

[22] Filed: Aug. 21, 1995

Related U.S. Application Data

[63] Continuation of Ser. No. 246,315, May 18, 1994, abandoned.

[30] Foreign Application Priority Data

May 20, 1993 [JP] Japan .................................. 5-139815

[51] Int. Cl.$^6$ ...................................................... H05K 1/00
[52] U.S. Cl. ........................... 361/749; 361/751; 361/776; 361/795; 174/260
[58] Field of Search ................................... 361/749–751, 361/760–764, 784, 776, 792–795; 174/254, 260–267; 439/67, 77

[56] References Cited

U.S. PATENT DOCUMENTS

| | | | |
|---|---|---|---|
| 4,508,766 | 4/1985 | Inaike et al. ............................. | 427/96 |
| 4,675,786 | 6/1987 | Mizuko et al. . | |
| 5,001,604 | 3/1991 | Lusby ....................................... | 29/846 |
| 5,161,009 | 11/1992 | Tanoi et al. ............................. | 257/668 |
| 5,219,640 | 6/1993 | Gazit et al. ............................. | 174/250 |

FOREIGN PATENT DOCUMENTS 60-154590   8/1985   Japan .
60-200586   10/1985  Japan .

*Primary Examiner*—Bot L. Ledynh
*Attorney, Agent, or Firm*—Sidley & Austin

[57] ABSTRACT

A multi-layer, flexible printed circuit device having a relatively rigid electronic component mounting portion and a relatively pliable connection wiring portion. The electronic component mounting portion comprises multiple layers of bases including at least one rigid base, and circuit pattern layers. The pliable connection wiring portion is formed by extending pliable bases and circuit pattern layers at one end. The rigidity of the electronic component mounting portion may be maintained by means of the rigid base or bases comprising a thick panel made of the same material as the pliable bases. Alternatively, the copper films of the circuit pattern layers may be made relatively thick or a base material with high rigidity may be used.

7 Claims, 2 Drawing Sheets

FLEXIBLE PRINTED CIRCUIT DEVICE

This application is a continuation of application Ser. No. 08/246,315, filed May 18, 1994 now abandoned.

BACKGROUND OF THE INVENTION

1. Field of the Invention

The present invention relates generally to printed circuit devices; and, more particularly, to a flexible printed circuit device having a relatively rigid electronic component mounting portion and a relatively pliable connection wiring portion.

2. Description of the Prior Art

In portable electronic equipment such as cameras, there is a need to incorporate complex electronic circuits in the relatively small space that is available inside such equipment. As such equipment has become more compact and multi-functional, printed circuit devices incorporating flexible substrates which can be freely bent have come to be used. However, due to its pliability, a flexible substrate tends not to remain flat when an electronic component is mounted on one side thereof; and, as a result, it is often not possible to properly mount electronic components on both sides of the substrate.

A rigid substrate, on the other hand, is capable of having electronic components properly mounted on both sides because it will remain flat even after an electronic component is mounted on one side. However, due to its lack of pliability, it cannot be bent freely and, thus, often cannot be fit into a small space.

FIG. 6 illustrates a known printed circuit device which comprises a multi-layer structure in an area where an electronic component 82 is mounted, and a single-layer structure which functions as a connection wiring portion 85 for connection of the device with another printed circuit device. The multi-layer structure is relatively rigid and includes bases 71, 73 and 76; circuit pattern layers 72, 74, 75 and 77; and cover films 78 and 79. Openings 86 provide for electrical interconnection between the circuit pattern layers as illustrated in the Fig.

The single-layer structure includes bases 71 and 73 and circuit pattern layer 72, and is formed using a pliable material.

However, even though the multi-layer structure is relatively rigid, if the single-layer connection wiring portion 85 is bent, bending stresses are applied to and tend to deform the multi-layer structure where electronic component 82 is mounted; and these bending stresses can cause the welding 83 of electronic component 82 to break and come off as shown in FIG. 6. Therefore, in a construction as shown in FIG. 6, it is necessary to provide a sufficient distance between the connection wiring portion and the portion where electronic component 82 is mounted in order to dissipate such bending stresses.

When pliability is needed in a multi-layer printed circuit device on which electronic components can be mounted close together, the following substrate constructions have been proposed: (1) substrates constructed such that rigid substrate portions and flexible substrate portions are connected via electrode terminals having spaces which allow precision, and (2) substrates having substrate layers which are rigid in the vicinity where electronic components are mounted but which are flexible in other areas. Proposed construction (2) includes, for example, substrates which are made pliable through a construction in which a rigid glass epoxy material and a pliable polyimide material are attached to each other to form the substrate, and in which electronic components are mounted on the rigid portion of the substrate formed of the glass epoxy material; and the bending area, which requires pliability, is formed of the polyimide material only by removing the glass epoxy material.

In substrates formed by connecting rigid substrate portions and flexible substrate portions via connecting terminals, as described in proposed construction (1) above, the total area of the substrate increases because a special area is required for the connecting terminals. Moreover, additional connecting work is required, thereby increasing the overall cost of the printed circuit device.

In substrates made by gluing together a rigid glass epoxy material and a pliable polyimide material as in proposed construction (2) above, on the other hand, the adhesion of the two substrates must be ensured, taking into consideration the different coefficients of thermal expansion of the two materials which gives rise to questionable reliability.

In addition, there is a process for removing the highly rigid substrate material from the bending portion which requires pliability. During this process, if residue from the removal process is left on a high-density, rigid substrate, unexpected problems such as defective operation of the circuits may occur. This necessitates a high level of care during processing and increases the cost of the substrate.

SUMMARY OF THE INVENTION

According to the present invention, a flexible printed circuit device is provided which has a first portion which is utilized as a mounting area of an electronic device and a second portion different from the first portion. The flexible printed circuit device includes a base member made of an insulator and which includes a first base portion corresponding to the first portion and a second base portion corresponding to the second portion, and an electro-conductive layer provided on the base member, wherein the first base portion has a thickness greater than that of the second base portion.

A flexible printed circuit device constructed according to the present invention, includes an electronic component mounting portion which has substantial rigidity and preferably comprises multiple substrate layers on which circuit pattern layers are formed, and a connection wiring portion which has substantial pliability so as to be able to be freely bent, and which preferably has fewer substrate layers than the electronic component mounting portion.

The electronic component mounting portion may be constructed such that the rigidity thereof is maintained by means of the thickness of the substrate layers (or bases) on which circuit pattern layers are formed, or by means of the thickness of the copper films which form the circuit pattern layers.

Alternatively, the electronic component mounting portion may be constructed by using a substrate formed of a highly rigid material and the connection wiring portion may be constructed by using a substrate formed of a material having little rigidity so that the pliability thereof is maintained.

Further, the rigidity may be maintained by forming a solid pattern in areas of circuit pattern layers for the electronic component mounting portion in which wiring cannot be laid.

Moreover, in a multi-layer flexible printed circuit device in which the number of substrates for the electronic component mounting portion and that for the connection wiring portion are equal, the construction may be such that the bases and the cover films for the electronic component mounting portion are thicker than the baseband the cover films for the connection wiring portion, or that the circuit pattern layers for the electronic component mounting portion be thicker than the circuit pattern layers for the connection wiring portion.

Because the electronic component mounting portion is rigid, electronic components can be mounted on both sides; and, because the connection wiring portion is pliable, it can be bent freely. Also, since the portions are integrally formed, no special area for connection wiring or special connection process is required. Therefore, a printed circuit device can be made employing fewer processes, yet still have higher density and more complexity than conventional circuits.

Further advantages and specific details of the present invention will become apparent hereinafter in conjunction with the following detailed description of presently preferred embodiments.

DETAILED DESCRIPTION OF THE PREFERRED EMBODIMENTS

Figure 1:
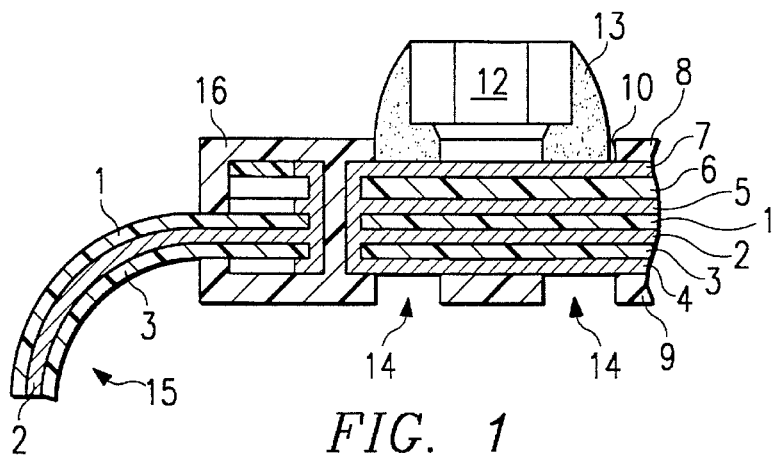
FIG. 1 is a cross-sectional view of a multi-layer, flexible printed circuit device according to a first embodiment of the present invention.

FIG. 1 is a cross-sectional view of a multilayer, flexible printed circuit device according to a first embodiment of the present invention having four circuit pattern layers. The device includes a first base 1 made of an insulator such as a polyimide material, a first circuit pattern layer 2 comprising an electro-conductive film, such as a copper film, formed on the lower side of first base 1, a second base 3 made of a polyimide material and located on the lower side of first circuit pattern 2, and a second circuit pattern layer 4 comprising a copper film formed on the lower side of second base 3.

First base 1, second base 3 and second circuit pattern layer 2 are extended on one end thereof, as shown, so as to form a connection wiring portion 15. First and second bases i and 3 have a thickness of, for example, 25-microns so that connection wiring portion 15 will be substantially pliable.

A third circuit pattern layer 5 comprises a copper film formed on the upper side of first base 1. A rigid base 6 comprises a polyimide material and is located on the upper side of third circuit pattern layers. A fourth circuit pattern layer 7 comprises a copper film formed on the upper side of rigid base 6, and a cover film 8 comprises a polyimide material and covers the outside of rigid base 6 and fourth circuit pattern layer 7. Cover film 8 includes an opening 10 at a location corresponding to the land of circuit pattern layer 7, and an electronic component 12 is welded by weld material 13 onto the land of fourth circuit pattern layer 7 at opening 10.

A cover film 9 Comprises a polyimide material covering the outside of second base 3 and second circuit pattern layer 4, and includes an opening 14; however, illustration of the connection of an electronic component onto the land of the second circuit pattern is omitted in FIG. 1 for ease in illustration.

A pierced hole 16 is formed through the first, second, third and fourth circuit pattern layers 2, 4, and 7, respectively, to provide for electrical interconnection of the circuit pattern layers.

In the construction of FIG. 1, rigid base 6 is used as the base supporting fourth circuit pattern layer 7 on which electronic component 12 is mounted, and is made thicker than first base 1 or second base 3 so that the necessary rigidity is obtained. The base is, for example, about 50-microns thick. In the alternative, cover films 8 or 9 or both may be made thick to obtain the needed rigidity, or cover films 8 and 9 and base 6 may all be made thick to obtain the needed rigidity.

Further, if fourth circuit pattern layer 7, on which electronic component 12 is mounted, is extended for use as the connection wiring portion, a thin material should be used for base 6 to ensure pliability of that portion, and thicker materials should be used for one or more of the other bases. Moreover, when it is desired to make the base that supports the circuit pattern layer on which electronic component 12 is to be mounted thin, while still obtaining rigidity, a resin with high rigidity such as aramid (Aromatic Polyamide) can be used.

Figure 2:
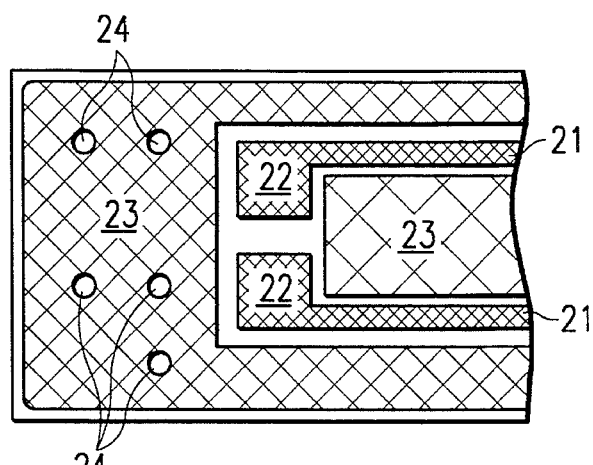
FIG. 2 is a plan view of a multi-layer flexible printed circuit device according to a second embodiment of the invention.

FIG. 2 is a plan view of a multi-layer, flexible printed circuit device according to a second embodiment of the present invention in which the electronic component mounted portion can be made more rigid than in the first embodiment. Specifically, on the substrate layer having minimal circuit patterns and lands, e.g., on the pattern layer formed on the, surface substrate layer in FIG. 2, a solid pattern 23 made of a copper film is formed over the entire substrate except for the areas of circuit pattern 21 and land 22, and this solid pattern 23 is connected with the pattern of an inner circuit pattern layer having ground potential via pierced holes 24.

By this construction, the rigidity of the substrate may be increased by means of solid copper film pattern 23 formed on a large area of the substrate layer.

Figure 3:
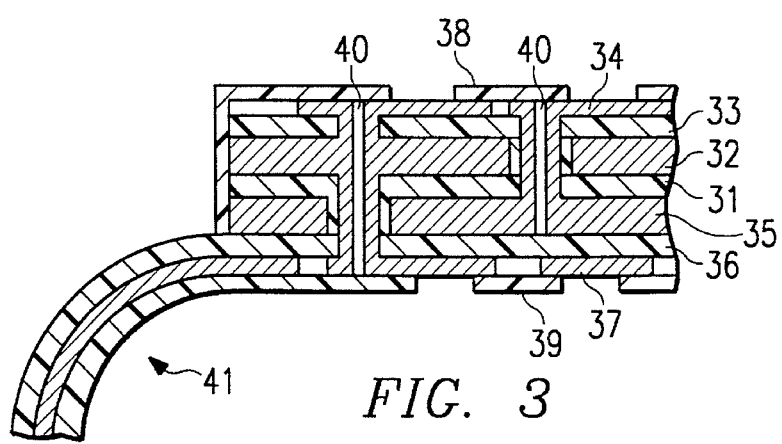
FIG. 3 is a cross-sectional view of a multi-layer flexible printed circuit device according to a third embodiment of the invention.

In a third embodiment of the present invention, shown in FIG. 3, the copper films of inner circuit patterns are made thick. In FIG. 3, base layers 31, 33 and 36 are made of a polyimide material, and reference numbers 32, 34, 35 and 37 refer to copper film circuit pattern layers. The copper films of inner circuit pattern layers 32 and 35 are made thicker than the copper films of surface circuit pattern layers 34 and 37. Fig, 3 further illustrates cover films 38 and 39, pierced holes 40, and a connection wiring portion 41.

In the embodiment of FIG. 3, when a solid pattern is formed on one of inner circuit pattern layers 32 or 3B, or both, and this pattern is given ground potential, not only can the rigidity of the overall substrate be increased, but, in addition, secondary effects, such as reduced impedance of the power line, may be obtained.

Figure 4:
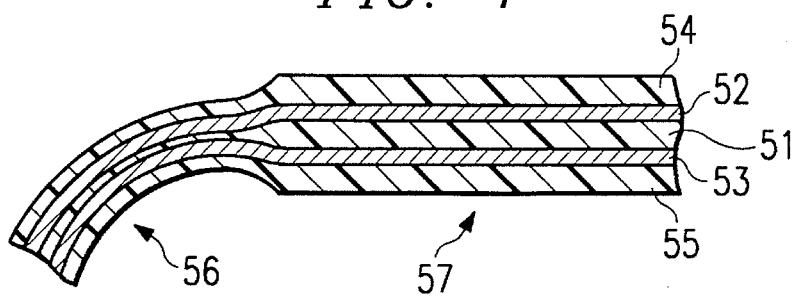
FIG. 4 is a plan view of a multi-layer flexible printed circuit device according to a fourth embodiment of the invention.

A fourth embodiment of the present invention, shown in FIG. 4, is a multi-layer, flexible printed circuit device in which the number of substrate layers for the electronic component mounting portion and for the connection wiring portion are equal. In this embodiment, circuit pattern layers 52 and 53 are formed on upper and lower sides of base 51, and cover films 54 and 55 cover them from the outside. The device is constructed such that base 51 and cover films 54 and 53 are thicker for electronic component mounting portion 57 than for the connection wiring portion 56. Also, in this construction, the rigidity of the device for the electronic component mounting portion may be increased while the pliability of the connection wiring portion is maintained.

Figure 5:
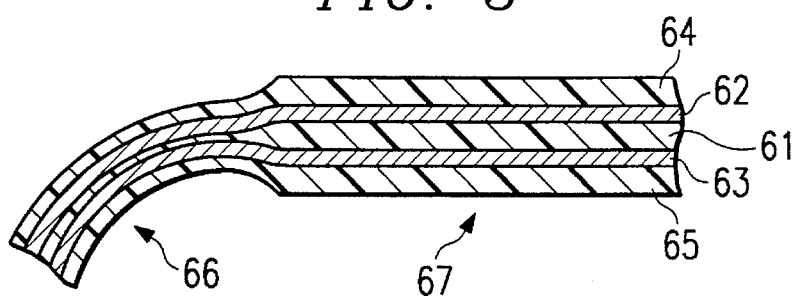
FIG. 5 is a cross-sectional view of a multi-layer flexible printed circuit device according to a fifth embodiment of the invention.
Figure 6:
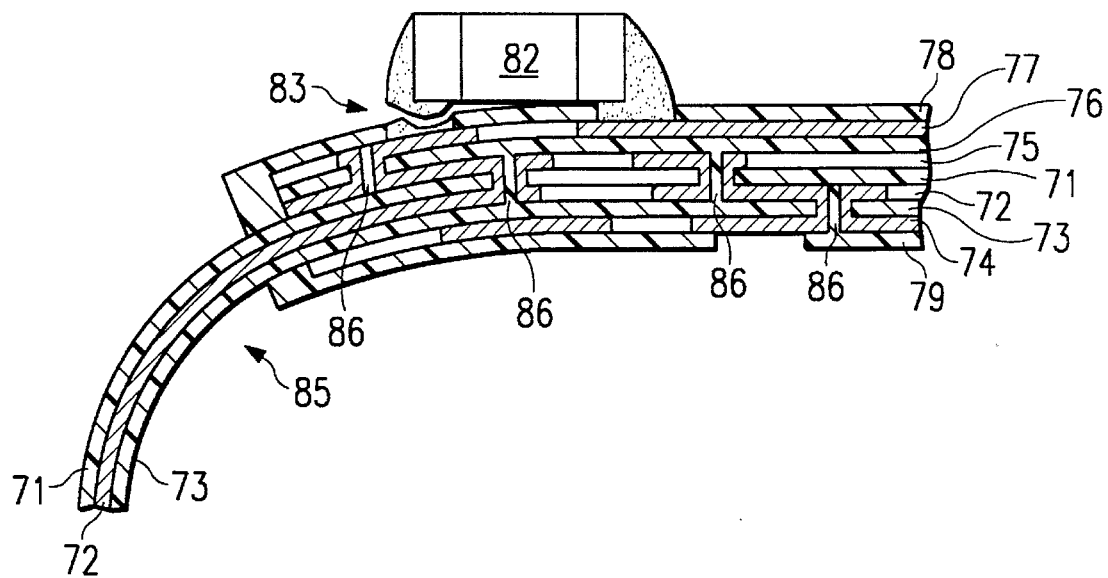
FIG. 6 is a cross-sectional view of a known multi-layer flexible printed circuit device.

A fifth embodiment of the present invention, shown in FIG. 5, also comprises a multi-layer, flexible printed circuit device in which the number of substrate layers for the electronic component mounting portion and that for the connection wiring portion are equal. In this device, circuit pattern layers 62 and 63 are formed on the upper and lower sides of base 61, and cover films 64 and 65 cover them from the outside. The device is constructed such that the copper films of circuit pattern layers 62 and 63 are thicker for electronic component mounting portion 67 than for connection wiring portion 66. In this construction as well, the rigidity of the device for the electronic component mounting portion may be increased while the pliability of the connection wiring portion is maintained.

Although the invention has been described in detail above with reference to preferred embodiments thereof, it should be understood that numerous variations and modifications exist within the scope and spirit of the invention, and that the invention should be limited only insofar as is required by the scope of the following claims.

I claim:

1. A flexible printed circuit device having a first portion which is utilized as a mounting area of an electronic device and a second portion different from said first portion, said flexible printed circuit device comprising:

a first base member made of a flexible insulator material and including a first base portion corresponding to said first portion and a second base portion corresponding to said second portion;

an electro-conductive layer provided on said first base member and including a first conductive portion corresponding to said first portion and a second conductive portion corresponding to said second portion;

a cover layer for covering said first conductive portion while maintaining said second conductive portion uncovered; and a second base member made of a flexible insulator material and which is superposed on said first base member, said electro-conductive layer and said cover layer provided on a portion corresponding to said first portion and having a rigidity greater than that of the first base member.

2. A flexible printed circuit device as defined in claim 1, further comprising a second electro-conductive layer provided on a portion of said second base member corresponding to said first portion, said cover layer covering said second electro-conductive layer.

3. A flexible printed circuit device as defined in claim 1, further comprising a second electro-conductive layer provided on said second base member, and wherein said electronic device is connected on said second electro-conductive layer.

4. A flexible printed circuit device having a first portion which is utilized as a mounting area of an electronic device and a second portion different from said first portion, said flexible printed circuit device comprising:

a first base member made of a flexible insulator material and including a first base portion corresponding to said first portion and a second base portion corresponding to said second portion; and a second base member made of a flexible insulator material and which is superposed on said first base member and having a rigidity greater than that of said first base member, said second base member being provided in a position corresponding to said first portion.

5. A flexible printed circuit device as defined in claim 4, wherein said second base member is made of polyimide material.

6. A flexible printed circuit device as defined in claim 4, wherein said second base member is made of Aramid material.

7. A flexible printed circuit as claimed in claim 1, further comprising:

a third base member made of a flexible insulator material and which is superposed on said first base member; and a second electro-conductive layer superposed on said first base portion of said first base member.

* * * * *